United States Patent [19]
Zommer

[11] Patent Number: 5,159,425
[45] Date of Patent: Oct. 27, 1992

[54] INSULATED GATE DEVICE WITH CURRENT MIRROR HAVING BI-DIRECTIONAL CAPABILITY

[75] Inventor: Nathan Zommer, Los Altos, Calif.

[73] Assignee: Ixys Corporation, San Jose, Calif.

[21] Appl. No.: 561,493

[22] Filed: Jul. 31, 1990

Related U.S. Application Data

[63] Continuation of Ser. No. 359,781, May 31, 1989, abandoned, which is a continuation-in-part of Ser. No. 204,042, Jun. 8, 1988, abandoned.

[51] Int. Cl.$^5$ .............. H01L 29/747; H01L 29/10; H01L 27/02; H03K 3/353
[52] U.S. Cl. ...................... 357/39; 357/23.4; 357/41; 357/45; 307/304
[58] Field of Search ............ 357/39, 23.4, 41, 45; 307/304, 570, 575; 323/15, 16, 17

[56] References Cited

U.S. PATENT DOCUMENTS

| | | | |
|---|---|---|---|
| Re. 30,173 | 12/1979 | Ahmed | 330/257 |
| 4,477,742 | 10/1984 | Janutka | 307/571 |
| 4,491,750 | 1/1985 | Janutka | 307/577 |
| 4,500,802 | 2/1985 | Janutka | 307/571 |
| 4,550,284 | 10/1985 | Sooch | 323/315 |
| 4,559,694 | 12/1985 | Yoh et al. | 357/42 |
| 4,574,207 | 3/1986 | Benjamin et al. | 307/577 |
| 4,574,209 | 3/1986 | Lade et al. | 307/577 |
| 4,599,554 | 7/1986 | Joycox et al. | 307/584 |
| 4,645,948 | 2/1987 | Morris et al. | 357/51 |
| 4,673,867 | 6/1987 | Davis | 323/315 |
| 4,680,490 | 7/1987 | Baker et al. | 307/575 |
| 4,682,195 | 7/1987 | Yilmaz | 357/23.4 |
| 4,694,207 | 9/1987 | Heuwieser et al. | 307/571 |
| 4,742,380 | 5/1988 | Chang et al. | 357/23.4 |
| 4,767,942 | 8/1988 | Minami et al. | 307/296.5 |
| 4,779,123 | 10/1988 | Bencuya et al. | 357/23.4 |
| 4,783,690 | 11/1988 | Walden et al. | 357/23.4 |
| 4,785,207 | 11/1988 | Eng | 307/577 |
| 4,811,065 | 3/1989 | Cogan | 357/23.4 |
| 4,814,724 | 3/1989 | Tanigawa | 323/315 |
| 4,829,231 | 5/1989 | Coupe et al. | 323/315 |
| 4,830,976 | 5/1989 | Morris et al. | 357/51 |
| 4,841,345 | 6/1989 | Majumdar | 357/38 |
| 4,855,618 | 8/1989 | Brokaw | 323/315 |
| 5,008,586 | 4/1991 | Miyazaki et al. | 323/316 |

FOREIGN PATENT DOCUMENTS 0201878 11/1986 European Pat. Off. .
59-225 1/1984 Japan .

OTHER PUBLICATIONS

Horowitz et al., *The Art of Electronics*, 1980, pp. 71–74.
R. Sittig and P. Roggwiller, "Semiconductor Devices for Power Conditioning", Plenum Press, New York, 1982.
N. Zommer and J. Biran, "Power Current Mirror Devices and Their Applications", PCI, Jun. 1986 Proceedings (pp. 275–283).

*Primary Examiner*—Mark Prenty
*Attorney, Agent, or Firm*—Townsend and Townsend

[57] ABSTRACT

A technique for providing dual direction current sensing with a single current mirror configured to provide the same current ratio in both directions for at least one predetermined temperature. The invention contemplates any of a number of techniques for providing relatively increased diode conduction in the mirror in order to provide the same current ratio as when channel conduction is the sole mechanism. These include increasing the doping of the cell body, increasing the diode area per cell relative to the amount of MOS channel area, providing extra diode cells in the mirror, or locating the current mirror in the hottest part of the chip where diode conduction is greatest.

24 Claims, 2 Drawing Sheets

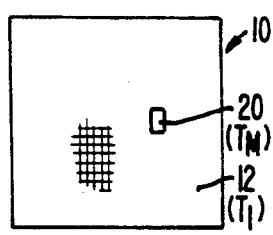
FIG._1A.
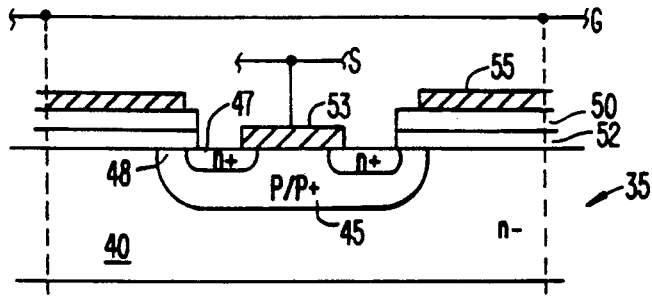
FIG._1B.
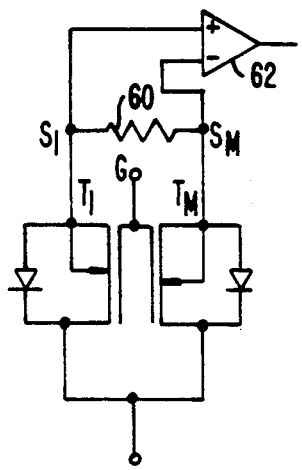
FIG._1D.
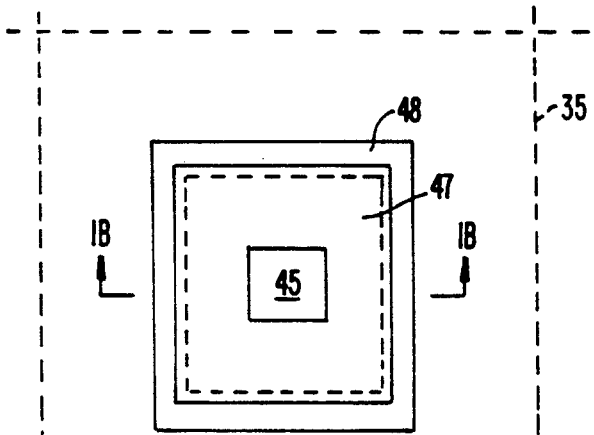
FIG._1C.
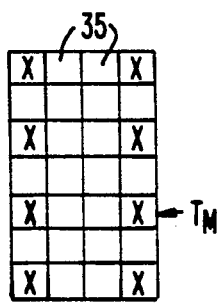
FIG._2A.
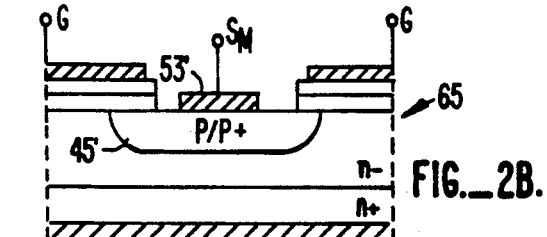
FIG._2B.
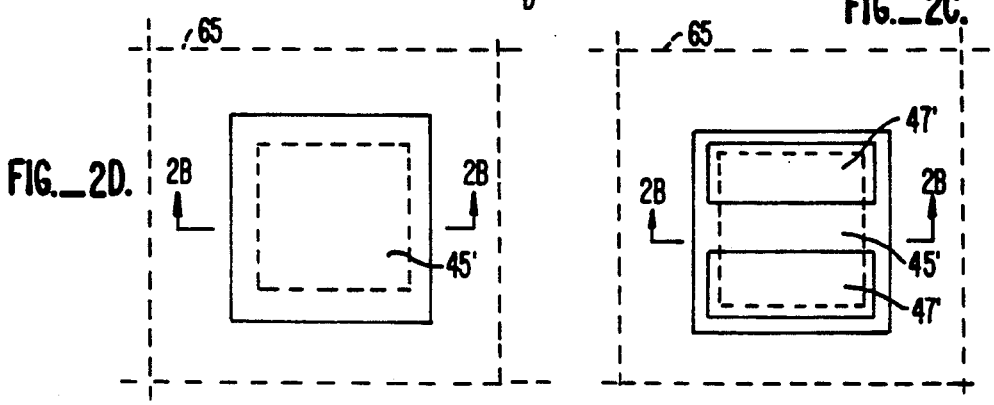
FIG._2D.   FIG._2C.

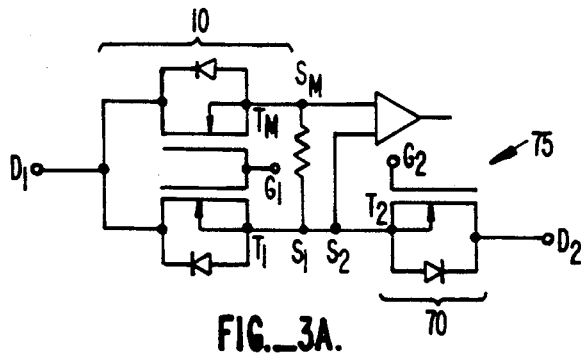
FIG._3A.
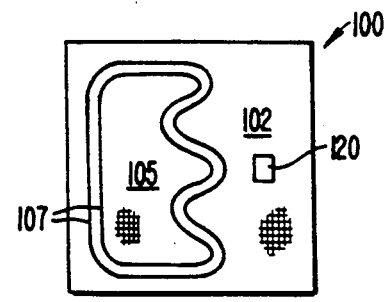
FIG._4.
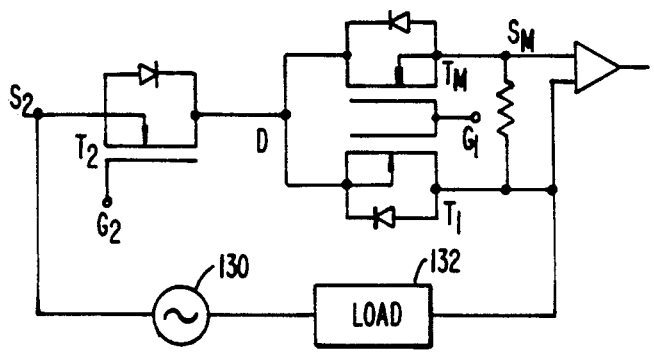
FIG._3B.
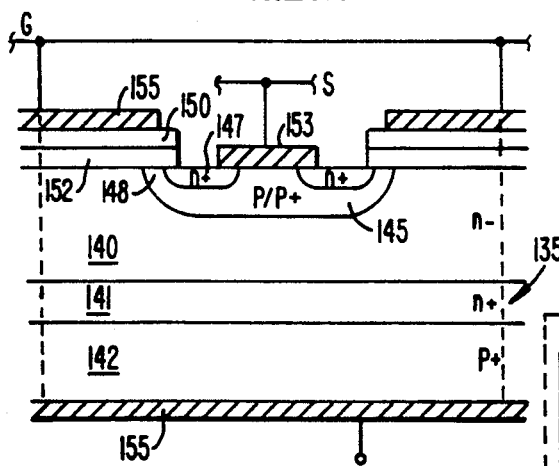
FIG._5A.
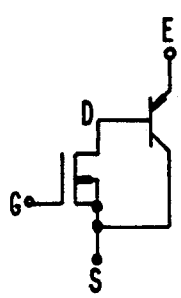
FIG._5B.
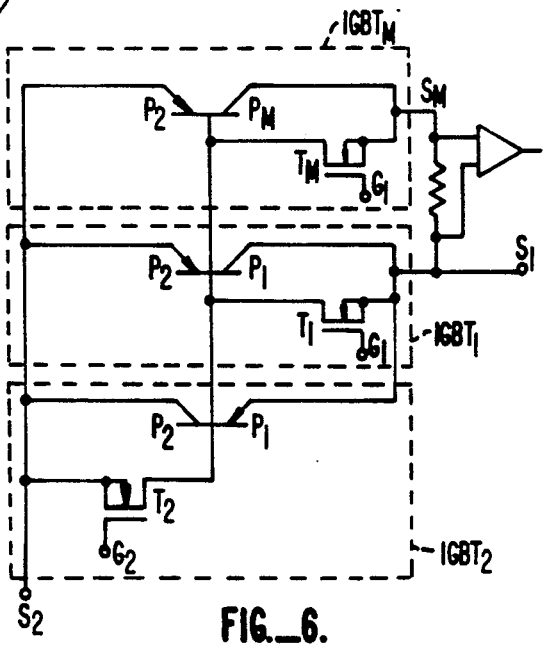
FIG._6.

INSULATED GATE DEVICE WITH CURRENT MIRROR HAVING BI-DIRECTIONAL CAPABILITY

CROSS REFERENCE TO RELATED APPLICATION

This application is a continuation of application Ser. No. 359,781 filed May 31, 1989, now abandoned, which is a continuation-in-part of application Ser. No. 204,042 filed Jun. 8, 1988, now abandoned.

BACKGROUND OF THE INVENTION

The invention relates generally to a semiconductor power device that controls AC power to a load, and more specifically to such a device having integral current monitoring.

In controlling the application of electrical power to a load, it is known practice to use a switching device in series with the load. Power MOS devices have proven to be very useful in this regard, at least for DC applications. The terms MOS and MOSFET (which originally stood for metal-oxide-semiconductor) are used to refer to insulated gate devices generally, notwithstanding the fact that most modern devices have polysilicon gates rather than metal gates.

AC switches using MOS technology are more complex in nature than DC switches, since AC switches need to conduct in both directions. It is known to create an AC switch by hooking up two MOSFET's as DC switches, either in a common drain or in a common source configuration. A somewhat simplified explanation for the AC operation of such a switch is that in a given polarity, one MOSFET conducts as a MOSFET while the other acts as a forward-biased diode in parallel with a MOSFET.

In most power electronics applications where AC power is controlled and delivered to a load, it is important to monitor and control the load current (which corresponds to the switch current) and the switch temperature. Certain properties of power MOSFET's make it possible to sense current, using the current mirror technique. Power MOSFET's are normally implemented as a plurality of discrete cells connected in parallel with gates in common, sources in common, and drains in common. The current mirror (or current sensor, as it is sometimes known) comprises a relatively small region of cells having their gates and drains in common with those of the main transistor and having their sources commonly connected to a separate output terminal. For example, the current mirror might comprise ten MOSFET cells while the main transistor comprised 10,000. The current flowing through the current mirror is found to be a predetermined fraction of the current flowing through the main transistor. If the mirror cells and the main cells are configured geometrically alike, the fraction corresponds roughly to the ratio of the numbers of cells (e.g., a current ratio of about 700:1 for a cell ratio of 1000:1).

SUMMARY OF THE INVENTION

The present invention is drawn to a technique for providing dual direction current sensing in a power MOS device. This is accomplished with a single current mirror which is configured to provide the same current ratio in both directions for at least one predetermined temperature. The invention finds applicability in such applications as AC switches and synchronous rectifiers.

The ability to configure a current mirror such that the ratio of main transistor current to mirror transistor current remains the same in both directions relies on a recognition of the reasons that the current ratio is normally different for the two directions of conduction. For drain-source current flow, conduction is solely through the MOS channel. Since a greater fraction of the mirror cells are on the periphery, the mirror tends to conduct more current per cell than the main transistor conducts per cell. For source-drain current flow, the conduction is through the parasitic diode, and possibly through the MOS channel depending on the gate voltage. In general, the diode conduction tends to dominate. Diode conduction is largely a function of cell area, so the mirror tends to conduct the same amount of current per cell as the main transistor conducts per cell for this direction.

The invention contemplates any of a number of techniques for providing relatively increased diode conduction in the mirror in order to provide the same current ratio as when channel conduction is the sole mechanism. These include increasing the doping of the cell body, increasing the diode area per cell relative to the amount of MOS channel area, providing extra diode cells in the mirror, or locating the current mirror in the hottest part of the chip where diode conduction is greatest.

A monolithic AC switch having the single current mirror that provides current sensing in both directions requires only five external connections (two gate terminals for the two main transistors, two source terminals for the two main transistors, and a single source terminal for the current mirror). While reduced pin count is a generally desirable objective, it has particular significance in this case since it allows the device to be packaged in a commercially available standard five-pin package. This provides a low packaging cost and low pin count, which render the AC switch suitable for the industrial, commercial, and consumer markets.

The monolithic AC switch may be configured to provide conductivity modulation so that the first and second main transistors operate like first and second insulated gate bipolar transistors ("IGBTS"). In such a case, some of the cell bodies of the first main transistor cooperate with cell bodies of the second main transistor to define the emitter of the bipolar transistor that forms part of the second IGBT for current flow in one direction, and vice versa for the other direction.

A further understanding of the nature and advantages of the present invention may be realized by reference to the remaining portions of this specification and to the attached drawings.

BRIEF DESCRIPTION OF THE DRAWINGS

FIG. 1A is a simplified top view of a chip containing a MOSFET with a current mirror according to the present invention;

FIG. 1B is a simplified cross-sectional view of one MOSFET cell;

FIG. 1C is a simplified top view of the MOSFET cell.

FIG. 1D is an equivalent circuit schematic of the chip of FIG. 1A, plus external circuitry;

FIG. 2A is a simplified top view showing the use of special cells in the current mirror;

FIG. 2B is a simplified cross-sectional view showing of a special cell in the current mirror;

FIG. 2C is a simplified top view of a special cell having reduced MOSFET conduction;

FIG. 2D is a simplified top view of a special cell having no MOSFET conduction;

FIG. 3A is an equivalent circuit schematic of an AC switch using discrete power MOSFET's in a common source configuration;

FIG. 3B is an equivalent circuit schematic of an AC switch using discrete power MOSFET's in a common drain configuration;

FIG. 4 is a simplified top view of a monolithic AC switch according to the present invention;

FIG. 5A is a simplified view of an IGBT cell;

FIG. 5B is a simplified equivalent circuit schematic of an IGBT; and

FIG. 6 is a simplified equivalent circuit schematic of a monolithic AC switch with conductivity modulation.

DESCRIPTION OF THE PREFERRED EMBODIMENTS

FIG. 1A is a simplified top view of a power MOSFET 10 formed on a semiconductor chip. MOSFET 10 can be used as a stand-alone device such as a synchronous rectifier suitable for use in such applications as high frequency, low voltage switching power supplies, or can be combined with another MOSFET (either discrete or monolithically formed) to define an AC switch, as will be described below. While the description will be in terms of n-channel devices, the application to p-channel devices is clear.

The chip is divided into a main transistor region 12 and a current mirror region 20. Region 12 defines the main transistor, designated $T_1$, while region 20 defines the current mirror transistor, referred to as the mirror and designated $T_M$. Transistor $T_1$ is implemented as a large number of individual cells (say 5000–10,000) connected in parallel, while mirror $T_M$ consists of a much smaller number of cells (say 20–30). As will be described below, at least some of the mirror cells are different from the main transistor cells in order to provide a current mirror that behaves comparably for both directions of current flow. These mirror cells will be referred to as special cells.

FIG. 1B is a simplified cross-sectional view of a normal MOSFET cell 35 as is found in transistor $T_1$ and mirror $T_M$. The normal cell is formed in an n- epitaxial ("epi") layer 40 which is deposited on the top side of an n+ substrate 42. Normal cell 35 comprises a p/p+ body 45 formed in epi layer 40 and a peripherally extending n+ source 47 formed within the perimeter of body 45. The source is slightly spaced in from the body perimeter so as to define a peripheral channel 48 at the epi surface. A polysilicon gate 50 overlies the channel (as well as the portions of the epi surface between cells) and is insulated therefrom by a thin layer 52 of gate oxide. A metal connection 53 connects the source and the central portion of the body to a source node S. A metal connection 55 connects the polysilicon layer to a gate node G. A metal layer 57 formed on the lower surface of substrate 42 defines a drain node D. Body 45 and epi layer 40 define a p-n junction (parasitic diode) that conducts when the source potential is sufficiently more positive than the drain potential.

FIG. 1C is a simplified top view of a normal cell, taken at the epi surface and shows channel region 48 extending around the periphery, source 47 spaced inwardly therefrom, and the central portion of body 45. The polysilicon layer overlies the plane of the figure, and its inner boundary is shown in phantom.

FIG. 1D is an equivalent circuit schematic of power MOSFET 10, together with external circuit elements normally connected to the chip during operation. Transistor $T_1$ and mirror $T_M$ have common gate and drain nodes G and D, and separate source nodes $S_1$, and $S_M$. Nodes G, $S_1$, $S_M$, and D are brought out as accessible pins to provide a 4-pin device. Each of the transistors is shown as having a parasitic diode connected in parallel. These diodes, which conduct in the source-drain direction are defined by the junction between the p/p+ body and the n-epi layer.

Source nodes $S_1$ and D are connected in-line in a circuit. A resistor 60 is connected between source nodes $S_1$ and $S_M$, and an operational amplifier 62 provides an output signal corresponding to the voltage drop across resistor 60. The resistor may be off the chip as an external element, or may be formed on the chip.

FIG. 2A is a simplified top view illustrating a typical configuration of the layout of one group of embodiments of current mirror $T_M$. As with the main transistor, the mirror comprises an array of cells; however, at least some of the mirror cells are different from the main transistor cells. In the illustrative embodiment, most of the mirror cells are so-called normal cells 35, configured like the cells of transistor $T_1$, while a number of the mirror cells are special cells 65 which have a different configuration.

As an aid to understanding the reason for configuring some mirror cells differently, it is helpful to consider how mirror $T_M$ would behave if its cells were all the same as the cells in transistor $T_1$. When conduction is from drain to source, the parasitic diode is reverse biased and conduction is solely via the MOS channel. Since the mirror region has a higher periphery-to-area ratio than the main transistor, the current through the peripheral cells can spread laterally beyond the cell boundaries. Thus, the current per cell in the mirror exceeds the current per cell in the main transistor, which consists of a greater fraction of interior cells. When conduction is from source to drain, the parasitic diode is forward biased and conduction is through the diode and the MOS channel in parallel. Conduction through the diode tends to dominate, and since it is primarily a function of cell area, the mirror and main transistor carry approximately the same current per cell. Therefore, the current ratios are different for the two directions of current flow, which tends to make the use of a single current mirror unsuitable for bi-directional current sensing. However, by configuring the special cells to provide relatively greater diode conduction, equal current ratios in both directions can be achieved, at least for a particular temperature.

FIG. 2B is a simplified cross-sectional view of one of special cells 65. Special mirror cell 65 is formed in a generally similar manner to the normal mirror cell, but is altered in one of several ways to provide proportionately more diode conduction (i.e. proportionately less MOSFET conduction). The special cell has a p/p+ body 45' and a metal connection 53' to the common source node $S_M$ for the normal and special cells in mirror $T_M$. However, the cell is formed either with a source region that extends only part way around the periphery of the cell or without a source region (making it a pure diode cell). Special cells 65 can alternatively be configured with the same geometry as normal cells 35, including a source extending around the entire periphery, but with enhanced p+ doping in the body region.

FIG. 2C shows one embodiment wherein the source designated 47' is formed only part way around the cell periphery so that MOSFET conduction only occurs for a portion of the periphery. FIG. 2D is a top view of another embodiment of the special cell in which no source region is provided so that no MOSFET conduction occurs.

A somewhat different approach requires no structural differentiation of the mirror cells. Since the diode conduction increases with temperature, it is sometimes possible to achieve the required enhanced diode conduction in the mirror by locating the mirror at the hottest portion of the chip (generally near the center). To the extent the temperature differential on the chip is insufficient to provide the necessary degree of current differential, it is possible to combine other techniques for enhancing diode conduction.

Power MOSFET 10 (with its special current mirror) may be connected to another power MOSFET chip 70, to define an AC switch. MOSFET 70 defines a transistor $T_2$ with respective source, gate, and drain nodes $S_2$, $G_2$, and $D_2$. FIG. 3A shows MOSFET's 10 and 70 in a common source configuration to define an AC switch 75. The common source configuration allows the use of a single gate drive. FIG. 3B shows the MOSFET's in a common drain configuration to define an AC switch 80. FIG. 3B also applies to a monolithic AC switch as described below.

FIG. 4 is a simplified top view of an AC switch 100 monolithically formed on a semiconductor chip. The monolithic version implements the common drain configuration of FIG. 3B. The same designations of the transistors and their nodes will be used.

The chip is divided into first and second transistor regions 102 and 105 separated by guard rings 107. Located within first transistor region 105 is a current mirror region 120. Regions 102 and 105 define the two main transistors, designated $T_1$ and $T_2$, of the switch, while region 120 defines the current mirror, designated $T_M$. Each of transistors $T_1$ and $T_2$ is implemented as a large number of individual cells (say 5000–10,000) connected in parallel, while current mirror $T_M$ consist of a much smaller number of cells (say 20–30). As was described above in connection with MOSFET 10, at least some of the mirror cells are different from the main transistor cells in order to provide a current mirror that behaves comparably for both directions of current flow.

The circuit schematic of monolithic AC switch 100 (together with external circuit elements) is the same as discrete AC switch 80 except that the common drain need not be brought out as an accessible pin. As above, current mirror $T_M$ is associated with transistor $T_1$, with which it shares gate and drain connections but has a separate source node $S_M$. Nodes $G_1$, $S_1$, $S_M$, $G_2$, and $S_2$ are brought out as accessible pins to provide a 5-pin device. In the case, of each of the AC switches, the series-coupled MOSFET's are connected to a series-coupled AC source 130 and load 132, shown in FIG. 3B.

In operation, when the output of AC source 130 is applied to load 132 and AC switch 75, 80, or 100, the current through the current mirror will be the same fraction of the current through the switch in both directions. Thus, the output of operational amplifier 62 will be a sine wave having an average value of 0. In the event that conditions change (such as overheating of the chip), the diode conduction will increase, and the current flow in the mirror will increase for one direction. The output from operational amplifier 62 will then have a DC offset, which can be communicated to suitable control circuitry. It is also possible to configure the mirror for symmetric operation at a temperature other than the intended operating temperature. In such a case, normal operation would be characterized by a DC offset in the output of operational amplifier 62. It is also possible to provide multiple current mirrors, each configured for symmetric operation at a different temperature. This would allow a user to use the chip under various operating conditions.

The monolithic AC switch illustrated in FIG. 4, while having an operation similar to the discrete version illustrated in FIG. 3B, has an inherent characteristic due to the fact that transistors $T_1$ and $T_2$ are fabricated on the same substrate. More particularly, if the two regions 102 and 105 are sufficiently interdigitated that a significant number of the MOSFET cells in transistor $T_1$ are reasonably near the MOSFET cells in transistor $T_2$, a degree of conductivity modulation occurs, and the MOSFET's behave to some extent like insulated gate bipolar transistors ("IGBT's"). The conductivity modulation occurs when the conductivity of one MOS device is modulated by the injection of minority carriers from the other MOS device. It should be noted that guard rings 107 do tend to reduce the effect.

FIG. 5A is a simplified cross-sectional view of a vertical IGBT cell 135 as is known in the prior art. The IGBT cell is formed in an n− epitaxial ("epi") layer 140 which is deposited on an n+ layer 141 formed on the top side of a p+ substrate 142. IGBT cell 135 comprises a p/p+ body 145 formed in epi layer 140 and a peripherally extending n+ source 147 formed within the perimeter of body 145. The source is slightly spaced in from the body perimeter so as to define a peripheral channel 148 at the epi surface. A polysilicon gate 150 overlies the channel (as well as the portions of the epi surface between cells) and is insulated therefrom by a thin layer 152 of gate oxide. A metal connection 153 connects the source and the central portion of the body to a source node S. A metal connection 155 connects the polysilicon layer to a gate node G. A metal layer 157 formed on the lower surface of substrate 142 defines an emitter node E. Body 145, epi layer 140, and p+ substrate 142 define the collector, base, and emitter of a pnp bipolar transistor.

FIG. 5B is a simplified equivalent circuit schematic of an IGBT as is known in the prior art. It does not show the parasitic NPN bipolar transistor. For a discrete IGBT, current flow occurs in one direction only (emitter to source). Thus an AC switch using discrete IGBT's back to back would require external diodes.

FIG. 6 is an equivalent circuit schematic of the monolithic AC switch where significant conductivity modulation (IGBT action) occurs. The switch includes $IGBT_1$, $IGBT_2$, and $IGBT_M$, associated with MOS transistors $T_1$, $T_2$, and $T_M$ respectively. In this case, the bodies of at least some of the cells of transistor $T_2$ act as the collector for the PNP transistors in $IGBT_1$ and $IGBT_M$. The bodies of at least some of the cells of transistors $T_1$ and $T_M$ act as the collector for the PNP transistor in $IGBT_1$. In the schematic, the bodies are denoted $P_1$, $P_2$, and $P_M$. If the switch is made on a p+ wafer, the effect is to limit the potential drop in the n− epi layer for current flowing laterally.

In operation, current flowing from $S_2$ to $S_1$ goes through MOS transistor $T_2$ and through $IGBT_1$ and $IGBT_M$. Current flowing from $S_1$ to $S_2$ goes through MOS transistors $T_1$ and $T_M$ and through $IGBT_2$.

As in the case of the switch with no IGBT action, symmetrical behavior of the current mirror is achieved by decreasing its MOSFET flow or enhancing its IGBT current flow relative to that through $IGBT_1$ by the use of special cells in the mirror. Reference to FIGS. 2A–C is appropriate.

In conclusion, it can be seen that the present invention provides an AC switch with current sensing requiring only a single current mirror that operates symmetrically in both directions. While the above is a complete description of the preferred embodiment of the invention, various modifications, alternative constructions, and equivalents may be used. Therefore, the above description and illustrations should not be taken as limiting the scope of the invention which is defined by the appended claims.

I claim:

1. An AC switch comprising:
   a semiconductor chip having a surface area defining first, second, and third regions;
   first, second, and third pluralities of cells formed in and on said first, second, and third regions, respectively, each cell in said first, second, and third pluralities defining an insulated gate transistor having a source, a drain, a channel between said source and said drain, and a gate over said channel, and a parasitic diode connected between said source and said drain;
   each cell in said first, second, and third pluralities being subject to current flow in either of first and second directions between its source and drain, with substantially all current flow in said first direction being through the channel of the cell's insulated gate transistor, and current flow in said second direction being at least in part through the cell's parasitic diode;
   the number of cells in said third plurality being significantly smaller than the number of cells in said second plurality;
   the insulated gate transistors in said first plurality of cells having their respective gates commonly connected to define a first gate node and their respective sources commonly connected to define a first source node;
   the insulated gate transistors in said second plurality of cells having their respective gates commonly connected to define a second gate node and their respective sources commonly connected to define a second source node;
   the insulated gate transistors in said third plurality of cells having their respective gates commonly connected to said second gate node, and their respective sources commonly connected to define a third source node;
   the insulated gate transistors in said first, second, and third pluralities having their respective drains commonly connected; and
   at least some of said third plurality of cells being referred to as special cells, each special cell being structurally different from the cells in said second plurality so that said third plurality of cells is characterized by a ration of parasitic diode conduction in said second direction to channel conduction in said first direction that is greater than the corresponding ratio for said second plurality of cells.

2. The switch of claim 1 wherein at least some of the cells in said first plurality of cells are sufficiently close to at least some of the cells in said second plurality of cells to provide conductivity modulation.

3. A semiconductor device comprising:
   a semiconductor chip having a top portion doped to a first conductivity type; and
   first and second pluralities of cells formed in and on said top portion, each of said cells having a body region of a second conductivity type opposite said first conductivity type, each of said first plurality of cells and each of at least some of said second plurality of cells being an insulated gate transistor cell having a source region of said first conductivity type within its associated body region, thereby defining a channel, and further having a gate insulated from said source and body regions and located over said channel;
   the body region of each of said cells together with adjacent portions of said top portion defining a parasitic diode having a characteristic diode conduction area;
   at least a subset of the cells in said second plurality being configured for proportionately greater diode conduction than the cells in said first plurality;
   said first plurality of cells being connected in parallel to define a power insulated gate transistor, said second set of cells being connected in parallel with each other and having at least one common node with said power insulated gate transistor to define a current mirror.

4. The device of claim 3 wherein said subset of cells in said second plurality have less channel area than the cells in said first plurality.

5. The device of claim 3 wherein said subset of cells in said second plurality have higher doping of their respective body regions than the cells in said first plurality.

6. The switch of claim 1 wherein at least some of said third plurality of cells are diode cells connected in parallel with said second plurality of cells.

7. The AC switch of claim 1 wherein at least some of said special cells are formed so that their respective parasitic diodes conduct more than the respective parasitic diodes of said second plurality of cells when current flows in said second direction.

8. The AC switch of claim 1 wherein at least some of said special cells are formed so that their respective insulated gate transistors have smaller channels than the channels of the respective insulated gate transistors of said second plurality of cells.

9. An AC switch comprising:
   a semiconductor chip having a surface area defining first, second, and third regions;
   first, second, and third pluralities cells, formed in and on said first, second, and third regions, respectively, each cell in said first, second, and third pluralities defining an insulated gate transistor having a source, a drain, a channel between said source and said drain, and a gate over said channel, and a parasitic diode connected between said source and said drain;
   each cell in said first, second, and third pluralities being subject to current flow in either or first and second directions between its source and drain, with substantially all current flow in said first direction being through the channel of the cell's insulated gate transistor, and current flow in said second direction being at least in part through the cell's parasitic diode;

the number of cells in said third plurality being significantly smaller than the number of cells in said second plurality;

the insulated gate transistors in said first plurality of cells having their respective gates commonly connected to define a first gate node and their respective sources commonly connected to define a first source node;

the insulated gate transistors in said second plurality of cells having their respective gates commonly connected to define a second gate node and their respective sources commonly connected to define a second source node;

the insulated gate transistors in said third plurality of cells having their respective gates commonly connected to said second gate node, and their respective sources commonly connected to define a third source node;

said first, second, and third pluralities of cells having a common drain node; and a fourth plurality of cells formed in and on said third region, each defining a diode connected between said third source node and said common drain node and oriented to conduct current in substantially only said second direction, so that the ratio of the current flowing through said third and fourth pluralities of cells to the current flowing through said second plurality of cells is the same for both said first and second directions of current flow for at least one predetermined temperature.

10. The switch of claim 9 wherein at least some of the cells in said first plurality of cells are sufficiently close to at least some of the cells in said second plurality of cells to provide conductivity modulation.

11. An AC switch comprising:
a semiconductor chip having a top portion doped to a first conductivity type;

first, second, and third pluralities of cells formed in and on said top portion, each of said first, second, and third pluralities of cells being insulated gate transistor cells having a body doped to a second conductivity type opposite said first conductivity type, a source doped to said first conductivity type formed within said body, thereby defining a channel, a drain doped to said first conductivity type, and a gate insulated from said source and body and located over said channel;

the body of each of said insulated gate transistor cells defining a junction with adjacent portions of said top portion, said junction defining a parasitic diode;

each cell in said first, second, and third pluralities being subject to current flow in either of first and second directions, with substantially all current flow in said first direction being through the cells's channel, and current flow in said second direction being at least in part through the cell's parasitic diode;

the number of cells in said third plurality being significantly smaller than the number of cells in said second plurality;

said first plurality of cells having their respective sources commonly connected, their respective drains commonly connected, and their respective gates commonly connected to define a first power insulated gate transistor, said second plurality of cells having their respective sources commonly connected, their respective drains commonly connected, and their respective gates commonly connected to define a second power insulated gate transistor, said first and second power insulated gate transistors having a common drain connection to define a main switch, said third plurality of cells having their respective sources commonly connected, their respective drains commonly connected to said common drain connection, and their respective gates commonly connected to define a current mirror; and at least some of said third plurality of cells being referred to as special cells, each special cell being structurally different form the cells in said second plurality so that said third plurality of cells is characterized by a ratio of parasitic diode conduction in said second direction to channel conduction in said first direction that is greater than the corresponding ratio for said second plurality of cells.

12. The AC switch of claim 11 wherein the bodies of at least some of said first plurality of cells cooperate with the bodies of at least some of said second plurality of cells to provide conductivity modulation.

13. The AC switch of claim 11 wherein the body of each special cell is more heavily doped than the body of each of the cells in said second plurality.

14. The AC switch of claim 11 wherein the channel of each special cell is smaller than the channel of each of the cells in said second plurality.

15. A semiconductor device comprising:
a semiconductor chip having a surface area defining first and second regions;

first and second pluralities of cells formed in and on said first and second regions, respectively, each cell in said first and second pluralities defining an insulated gate transistor having a source, a drain, and a parasitic diode connected between said source and said drain;

each cell in said first and second pluralities being subject to current flow in either of first and second directions between its source and drain, with substantially all current flow in said first direction being through the cell's insulated gate transistor, and current flow in said second direction being at least in part through the cells's parasitic diode;

the number of cells in said second plurality being significantly smaller than the number of cells in said first plurality;

the insulated gate transistors in said first plurality of cells having their respective gates commonly connected to define a first gate node and their respective sources commonly connected to define a first source node;

the insulated gate transistors in said second plurality of cells having their respective gates commonly connected to define a second gate node and their respective sources commonly connected to define a second source node;

the insulated gate transistors in said first and second pluralities having their respective drains commonly connected; and at least some of said second plurality of cells being referred to as special cells, each special cell being structurally different from the cells in said first plurality so that said second plurality of cells is characterized by a ratio of parasitic diode conduction in said second direction to channel conduction in said first direction that is greater than the corresponding ratio for said first plurality of cells.

16. The device of claim 15 wherein at least some of said special cells are formed so that their respective parasitic diodes conduct more than the respective parasitic diodes of said first plurality of cells when current flows in said second direction.

17. The AC device of claim 15 where at least some of said special cells are formed so that their respective insulated gate transistors have smaller channels than the channels of the respective insulated gate transistors of said first plurality of cells when current flows in said first direction.

18. A semiconductor device comprising:
a semiconductor chip having a surface area defining first and second regions;
first and second pluralities cells, formed in and on said first and second regions, respectively, each cell in said first and second pluralities defining an insulated gate transistor having a source, a drain, a channel between said source and said drain, and a gate over said channel, and a parasitic diode connected between said source and said drain;
each cell in said first and second pluralities being subject to current flow in either of first and second directions between its source and drain, with substantially all current flow in said first direction being through the cell's insulated gate transistor, and current flow in said second direction being at least in part through the cell's parasitic diode;
the number of cells in said second plurality being significantly smaller than the number of cells in said first plurality;
the insulated gate transistors in said first plurality of cells having their respective gates commonly connected to define a first gate node and their respective sources commonly connected to define a first source node;
the insulated gate transistors in said second plurality of cells having their respective gates commonly connected to define a second gate node and their respective sources commonly connected to define a second source node;
said first and second pluralities of cells having a common drain node; and
a third plurality of cells formed in and on said second region, each defining a diode connected between said second source node and said common drain node and oriented to conduct current in substantially only said second direction, so that the ratio of the current flowing through said second and third pluralities of cells to the current flowing through said first plurality of cells is the same for both said first and second directions of current flow for at least one predetermined temperature.

19. A semiconductor device comprising:
a semiconductor chip having a top portion doped to a first conductivity type;
first and second pluralities of cells formed in and on said top portion, each of said first and second pluralities of cells being insulated gate transistor cells having a body of a second conductivity type opposite said first conductivity type and a source of said first conductivity type formed within said body, thereby defining a channel, and further having a gate insulated from said source and body and located over said channel;
the body of each of said insulated gate transistor cells defining a junction with adjacent portion of said top portion, said junction defining a parasitic diode;
each cell in said first and second pluralities being subject to current flow in either of first and second directions between its source and drain, with substantially all current flow in said first direction being through the cell's channel, and current flow in said second direction being at least in part through the cell's parasitic diode;
the number of cells in said second plurality being significantly smaller than the number of cells in said first plurality;
said first plurality of cells having their respective source regions commonly connected, their respective drains commonly connected, and their respective gates commonly connected to define a power insulated gate transistor, said second plurality of cells having their respective sources commonly connected and their respective gates commonly connected to define a current mirror; and
at least some of said second plurality of cells being referred to as special cells, each special cell being structurally different from the cells in said first plurality so that said second plurality of cells is characterized by a ratio of parasitic diode conduction in said second direction to channel conduction in said first direction that is greater than the corresponding ratio for said first plurality of cells.

20. The semiconductor device of claim 19 wherein the body of each special cell is more heavily doped than the body of each of the cells in said first plurality.

21. The semiconductor device of claim 19 wherein the channel of each special cell is smaller than the channel of each of the cells in said first plurality.

22. An AC switch comprising:
a semiconductor chip having a surface area defining first, second, and third regions;
first, second, and third pluralities of cells formed in and on said first, second, and third regions, respectively, each cell in said first, second, and third pluralities defining an insulated gate transistor having a source, a drain, a channel between said source and said drain, and a gate over said channel, and a parasitic diode connected between said source and said drain;
each cell in said first, second, and third pluralities being subject to current flow in either of first and second directions between its source and drain, with substantially all current flow in said first direction being through the channel of the cell's insulated gate transistor, and current flow in said second direction being at least in part through the cell's parasitic diode;
the number of cells in said third plurality being significantly smaller than the number of cells in said second plurality;
the insulated gate transistors in said first plurality of cells having their respective gates commonly connected to define a first gate node and their respective sources commonly connected to define a first source node;
the insulated gate transistors in said second plurality of cells having their respective gates commonly connected to define a second gate node and their respective sources commonly connected to define a third source node;

the insulated gate transistors in said third plurality of cells having their respective gates commonly connected to said second gate node, and their respective sources commonly connected to define a third source node;

the insulated gate transistors in said first, second, and third pluralities having their respective drains commonly connected; and said third plurality of cells being positioned on said chip at a location that is at substantially the highest temperature on said chip, so that conduction in said second direction through the parasitic diodes of said third plurality of cells is on the average greater than for said second plurality of cells.

23. The switch of claim 22 wherein at least some of the cells in said first plurality of cells are sufficiently close to at least some of the cells in said second plurality of cells to provide conductivity modulation.

24. A semiconductor device comprising:

a semiconductor chip having a surface area defining first and second regions;

first and second pluralities of cells formed in and on said first and second regions, respectively, each cell in said first and second pluralities defining an insulated gate transistor having a source, a drain, and a parasitic diode connected between said source and said drain;

each cell in said first and second pluralities being subject to current flow in either of first and second directions between its source and drain, with substantially all current flow in said first direction being through the cell's insulated gate transistor, and current flow in said second direction being at least in part through the cell's parasitic diode;

the number of cells in said second plurality being significantly smaller than the number of cells in said first plurality;

the insulated gate transistors in said first plurality of cells having their respective gates commonly connected to define a first gate node and their respective sources commonly connected to define a first source node;

the insulated gate transistors in said second plurality of cells having their respective gates commonly connected to define a second gate node and their respective sources commonly connected to define a second source node;

the insulated gate transistors in said first and second pluralities having their respective drains commonly connected; and said second plurality of cells being positioned on said chip at a location that is at substantially the highest temperature on said chip, so that conduction in said second direction through the parasitic diodes of said second plurality of cells is on the average greater than for said second plurality of cells.

* * * * *